US006925629B2

(12) United States Patent
Yoshimura et al.

(10) Patent No.: US 6,925,629 B2
(45) Date of Patent: Aug. 2, 2005

(54) RETICLE FABRICATION METHOD

(75) Inventors: Takashi Yoshimura, Tokyo (JP); Takeshi Bashomatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/652,026

(22) Filed: Sep. 2, 2003

(65) Prior Publication Data

US 2004/0044981 A1 Mar. 4, 2004

(30) Foreign Application Priority Data

Sep. 2, 2002 (JP) .................................. 2002-256920

(51) Int. Cl.$^7$ .............................................. G06F 17/50
(52) U.S. Cl. ........................ 716/19; 716/21; 716/3; 716/5; 382/144
(58) Field of Search ................... 716/19, 21, 5, 716/3; 382/144

(56) References Cited

U.S. PATENT DOCUMENTS

| 5,481,624 | A | * | 1/1996 | Kamon | 382/144 |
| 5,943,437 | A | * | 8/1999 | Sumie et al. | 382/149 |
| 6,007,949 | A | * | 12/1999 | Nakajima | 430/5 |
| 6,010,827 | A | * | 1/2000 | Nakajima | 430/296 |
| 6,272,236 | B1 | * | 8/2001 | Pierrat et al. | 382/144 |
| 6,401,235 | B1 | * | 6/2002 | Ashida | 716/19 |
| 6,723,973 | B2 | * | 4/2004 | Saito | 250/492.22 |
| 2003/0093251 | A1 | * | 5/2003 | Chang | 703/13 |

FOREIGN PATENT DOCUMENTS

| JP | 03084441 A | * | 4/1991 | ......... H01L/21/027 |
| JP | 4-252044 A | | 9/1992 | |
| JP | 5-265192 A | | 10/1993 | |
| JP | 11135405 A | * | 5/1999 | ........... G06F/15/60 |

* cited by examiner

*Primary Examiner*—Stacy A. Whitmore
*Assistant Examiner*—Sun James Lin
(74) *Attorney, Agent, or Firm*—Sughrue Mion, PLLC

(57) ABSTRACT

CAD (Computer Aided Design) data which is reticle design data is input to first and second data conversion devices which respectively convert the CAD data to electron beam (EB) write data and inspection data. The EB write data and inspection data output are input to a data verification device to verify whether or not there is a data conversion error. If no data conversion error is detected by the data verification device, an EB writing device writes a pattern on an unwritten reticle with an electron beam based on the EB write data and develops the reticle, after which the fabricated developed reticle is inspected by a reticle inspection device. As a defect, such as a data conversion error contained in EB write data is detected before fabrication of a reticle, the reticle inspection process is simplified, the effective availability factors of the EB writing device and reticle inspection device and the time needed to fabricate a reticle is made shorter, thereby reducing the fabrication cost.

12 Claims, 10 Drawing Sheets

RETICLE FABRICATION METHOD

FIELD OF THE INVENTION

The present invention relates to a method of fabricating masks for a photolithography process performed on a reticle or the like which is used in fabricating a semiconductor integrated circuit device.

DESCRIPTION OF RELATED ART

In the photolithography process that is essential in the fabrication process for a semiconductor integrated circuit device, generally, a mask called a reticle which is acquired by writing the design pattern of a desired semiconductor integrated circuit on a light transmittive substrate, such as a quartz glass substrate, with a light shielding material such as chromium (Cr) is used as a master plate. The present photolithography technology generally employs a scheme of transferring a circuit pattern written on the reticle onto a semiconductor wafer with a photoresist applied thereto by reduction exposure by a factor of 4 to a factor of 5.

The microfabrication technology for semiconductor integrated circuits demands microfabrication achieved at a speed faster than is specified in the technology road map made by the SIA (Semiconductor Industry Association). The rapid advancement of the microfabrication technology shortened the wavelengths of light sources to be used at the time of exposing a circuit pattern written on a reticle onto a semiconductor wafer and progressed the developments of the light sources to various types, such as g rays, i rays, KrF and ArF. The photolithography technology that uses short-wavelength light sources, such as the KrF and ArF, employs super resolution techniques, such as OPC (Optical Proximity Correction) and phase shifting, for the purpose of acquiring a sufficient resolution which matches a micro circuit pattern. In this respect, circuit patterns to be written on reticles become extremely complex as well as become microfabricated more finely.

The amount of data that is handled at the time of writing a circuit pattern on a reticle becomes very huge due to the microfabrication and complexity of circuit patterns to be written on reticles. This leads to significant increases in the time and cost needed to fabricate reticles. For further microfabrication of circuit patterns, developments on photolithography technologies using VUV (Vacuum UltraViolet-ray) and EUV (Extreme UltraViolet-ray) have been set forward already but for the fear of the limitation to the light-based photolithography technology, there is a demand for earlier developments on photolithography technologies using X rays and an electron beam (EB). It is therefore expected that increases in the time and cost needed to fabricate reticles become more prominent.

FIG. 1 is a flowchart illustrating a conventional reticle fabrication method. CAD (Computer Aided Design) data 101 such as the design pattern of a semiconductor integrated circuit is converted to an electron beam (EB) write data 103 by a first data conversion device 102. The EB write data 103 is input to an EB writing device 104 which writes a figure pattern such as a circuit pattern on an unwritten reticle 105 based on the input EB write data 103 to thereby yield a written reticle 106. The written reticle 106 is developed to be a developed reticle 107 which is inspected in a reticle inspection device 110 to check if the reticle 107 includes a pattern which is the CAD data 101 correctly transferred. Meanwhile, the CAD data 101 is converted to inspection data 109 in a second data conversion device 108. The inspection data 109 is input to the reticle inspection device 110 and is used to check if there is an error in the figure pattern written on the developed reticle 107. If it is verified through the inspection that the figure pattern is formed on the developed reticle 107 correctly, the developed reticle 107 is discriminated as good and becomes an inspected reticle 111.

In the conventional reticle fabrication method, the EB write data 103 that has been generated through data conversion in the first data conversion device 102 is input to the EB writing device 104 without undergoing an inspection process and the figure pattern is written on the unwritten reticle 105. Even in case where a data conversion error has occurred, generating an erroneous EB write data 103, in the first data conversion device 102, therefore, the data conversion error cannot be detected in the EB writing device 104 before writing the figure pattern on the unwritten reticle 105. Even in case where a defect on the developed reticle 107 is detected in the inspection process in the reticle inspection device 110, it is extremely difficult to determine whether the defect is originated from a conversion error occurred in the first data conversion device 102 or occurred in the second data conversion device 108, or to determine whether the defect is a fabrication defect generated in the writing process or in the developing process. The reticle inspection device 110 detects if there is a defect in the figure pattern formed on the developed reticle 107 by comparing a to-be-inspected image acquired from the figure pattern formed on the developed reticle 107 with a reference image generated from the inspection data 109. When a mismatch between the to-be-inspected image and the reference image is detected, it is necessary to start with the work of checking if the EB write data 103 contains a data conversion error in order to find a cause for the mismatch. In case where a data conversion error is detected, it is necessary to correct the data conversion in the first data conversion device 102 and regenerate the EB write data 103. This makes the read time for fabrication of a reticle considerably longer.

Japanese Patent Laid-Open No. 252044/1992 discloses a method which is designed for the purpose of shortening the time needed for reticle fabrication and detects a reflection signal of an electron beam, irradiated on a quartz glass substrate, from the substrate's surface when writing a circuit pattern on a quartz glass substrate to be reticle so as to ensure simultaneous execution of EB writing and a surface inspection of the adhesion of a foreign matter or the like and an inspection of a pattern data for a pattern defect or the like at the time of writing the circuit pattern on the quartz glass substrate to be reticle. The prior art can detect if there is a defect in a pattern to be formed on a reticle at the time of carrying out EB writing. It is therefore possible to detect if there is a defect in a pattern on a written reticle at the early stage of the fabrication flow, thus ensuring simplification and shortening of the subsequent inspection process. This suppresses a wasteful operation of the expensive reticle inspection device which should face with an issue of the effective availability factor.

While the prior art can detect a defect at the time of writing a circuit pattern on a reticle, however, it cannot specify the cause for a defect, if detected. To find out the cause for a detected defect, therefore, the prior art, like the other prior arts, should verify if EB write data contains a data conversion error. Further, the fabrication cost would be increased significantly if the EB writing device which, like the reticle inspection device, is expensive and should face with an issue of the effective availability factor is operated to write a circuit pattern on a reticle based on EB write data containing a data conversion error. Furthermore, the reticle that is fabricated based on such erroneous EB write data would be wasted.

Japanese Patent Laid-Open No. 265192/1993 discloses a reticle fabrication method which verifies fabrication data for writing a pattern on a reticle before fabricating the reticle.

This prior art does not however achieve the demanded early detection of a data conversion error in a data conversion device. In other words, there is no issue of distinguishing that data conversion error from other fabrication defects. Therefore, the last prior art document also fails to disclose any specific means of solving the problem of the elongation of the reticle fabrication process and the cost increase both originated from such a data conversion error.

SUMMARY OF THE INVENTION

Accordingly, it is an object of the invention to provide a reticle fabrication method which simplifies a reticle inspection process, improves the effective availability factors of devices needed for reticle fabrication, such as an EB write device and a reticle inspection device, shortens the time needed for reticle fabrication and cuts down the fabrication cost by detecting a defect, such as a data conversion error included in EB write data like a circuit pattern to be written on a reticle A reticle fabrication method according to the first aspect of the invention comprises the steps of converting CAD (Computer Aided Design) data which is reticle design data to electron beam write data by means of a first data conversion device and to inspection data by means of a second data conversion device; comparing the electron beam write data with the inspection data in a data verification device to verify whether or not there is a data conversion error; fabricating a reticle using the electron beam write data after verifying that the electron beam write data is data correctly converted from the CAD data; and inspecting a quality of the reticle based on the inspection data.

A reticle fabrication method according to the second aspect of the invention comprises the steps of converting first electron beam write data for writing a figure pattern on a reticle based on reticle design data to second electron beam write data by means of a first data conversion device and to inspection data by means of a second data conversion device; comparing the second electron beam write data with the inspection data in a data verification device to verify whether or not there is a data conversion error; fabricating a reticle using the second electron beam write data after verifying that the second electron beam write data is data correctly converted from the first electron beam write data; and inspecting a quality of the reticle based on the inspection data.

A reticle fabrication method according to the third aspect of the invention comprises the steps of converting CAD (Computer Aided Design) data which is reticle design data to electron beam write data by means of a first data conversion device; comparing the electron beam write data with the CAD data in a data verification device to verify whether or not there is a data conversion error; fabricating a reticle using the electron beam write data after verifying that the electron beam write data is data correctly converted from the CAD data; and inspecting a quality of the reticle based on inspection data acquired by performing data conversion of the electron beam write data by means of a second data conversion device.

A reticle fabrication method according to the fourth aspect of the invention comprises the steps of converting CAD (Computer Aided Design) data which is reticle design data to first electron beam write data and second electron beam write data by means of a first data conversion device and to first inspection data and second inspection data by means of a second data conversion device; comparing the first electron beam write data with the first inspection data in a first data verification device to verify whether or not there is a data conversion error; comparing the second electron beam write data with the second inspection data in a second data verification device to verify whether or not there is a data conversion error; fabricating a reticle using the first and second electron beam write data after verifying that the first and second electron beam write data are data correctly converted from the CAD data; and inspecting a quality of the reticle based on the first and second inspection data.

In those reticle fabrication methods, the data verification device can be constructed so as to verify whether or not there is a data conversion error by converting the electron beam write data and the inspection data to raster images to be used by an electron beam writing device of a raster scan and stage continuous moving type and comparing the raster images with each other.

The data verification device may verify whether or not there is a data conversion error by converting the electron beam write data and the inspection data to two-dimensional coordinate data and comparing the two-dimensional coordinate data with each other.

The reticle fabrication methods according to the invention use two data conversion devices to separately generate EB write data for writing a pattern on a reticle and inspection data for inspecting the reticle from CAD data or EB write data through data conversion and allow the data verification device to verify if there is a data conversion error contained in those data before EB writing to fabricate the reticle. This can reliably prevent fabrication of a defective reticle originated from a data conversion error. In case where a data conversion error is detected by the data verification device, the cause for the data conversion error occurred in each data conversion device can be found out instantaneously before reticle writing, it is possible to avoid writing a wasteful defective reticle, simplify the reticle inspection process and shorten the reticle fabrication period. This can lead to a noticeable reduction in reticle fabrication cost. Even in case where the reticle inspection device detects a defect on an EB-written and developed reticle, it is apparent that the cause for the defect is not a data conversion error, thus making it extremely easy to find out the cause for the defect. Therefore, not only the cause for a defect, such as a data conversion error, which occurs at an early stage of the fabrication process, but also the cause for a defect which is generated at a later stage of the fabrication process, such as the EB writing process or the developing process, can be found out easily at an early stage after the end of the process where such a defect has occurred.

DETAILED DESCRIPTION OF THE PREFERRED EMBODIMENTS

Figure 1:
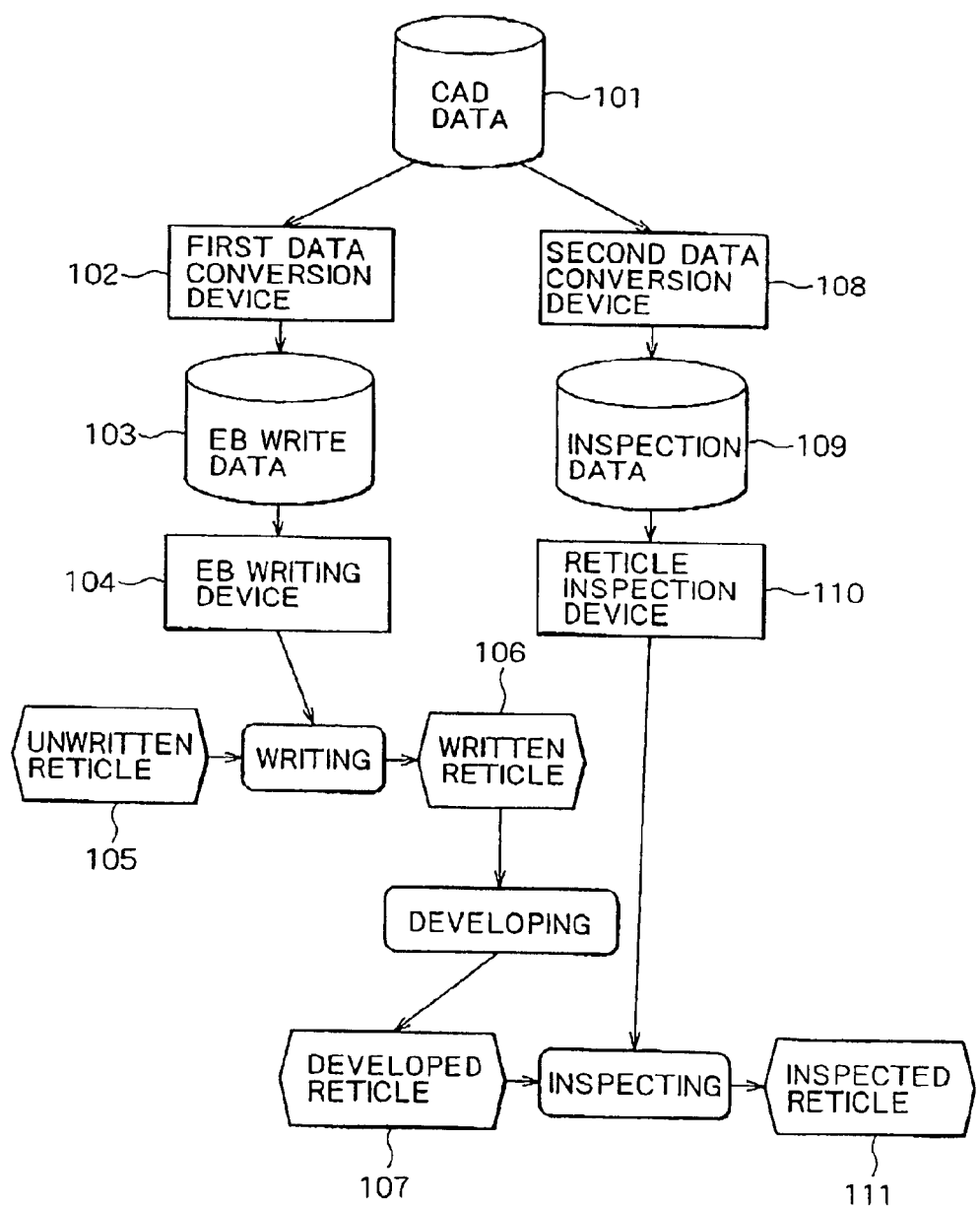
FIG. 1 is a flowchart illustrating a conventional reticle fabrication method.

Preferred embodiments of the invention will be described below with reference to the accompanying drawings. To avoid the redundant description, same reference numerals as given to the components of the first embodiment will be given to those components of the other embodiments which are identical to the corresponding components of the first embodiment throughout the specification.

Figure 2:
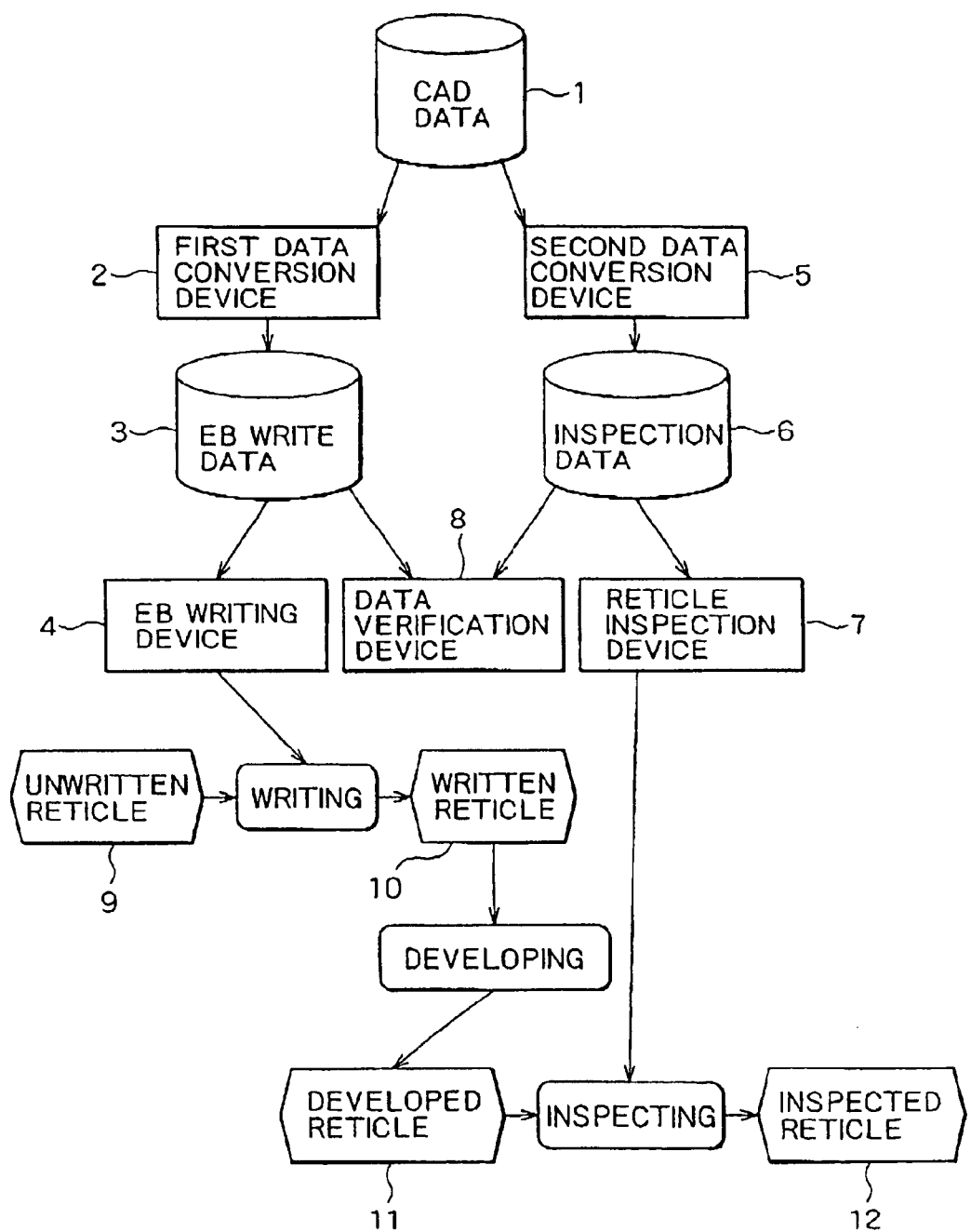
FIG. 2 is a flowchart illustrating a reticle fabrication method according to a first embodiment of the invention.

FIG. 2 is a flowchart illustrating a reticle fabrication method according to the first embodiment of the invention. In the embodiment, CAD data 1 or reticle design data is input to a first data conversion device 2 and a second data conversion device 5. The first data conversion device 2 performs a conversion process, such as rotation, magnification, reduction, expansion or contraction, on a figure pattern contained in the CAD data 1 and performs format conversion on the resultant data to thereby convert the CAD data 1 to EB write data 3. The second data conversion device 5 performs a conversion process and format conversion on the figure pattern contained in the CAD data 1, which are similar to those done by the first data conversion device 2, thereby converting the CAD data 1 to inspection data 6. The EB write data 3 and the inspection data 6 are input to a data verification device 8. The data verification device 8 verifies if the first data conversion device 2 and the second data conversion device 5 have performed data conversion correctly by comparing information on the figure patterns contained in the input EB write data 3 and inspection data 6 with each other. If the data verification device 8 verifies that the EB write data 3 is data correctly converted from the CAD data 1, the EB write data 3 is input to an EB write device 4 and is used as data for the EB write device 4 to write a figure pattern based on the CAD data 1 on an unwritten reticle 9. The EB write device 4 writes the figure pattern on the unwritten reticle 9 based on the input EB write data 3, thereby yielding a written reticle 10. The written reticle 10 is developed to become a developed reticle 11 which is in turn inspected by a reticle inspection device 7. The reticle inspection device 7, which is supplied with the inspection data 6, generates a reference image from the input inspection data 6. The reticle inspection device 7 also generates a to-be-inspected image from information obtained by scanning the surface of the developed reticle 11 with an ultraviolet laser and inspects if the figure pattern matching with the information of the CAD data 1 is correctly formed on the developed reticle 11 by comparing the to-be-inspected image with the reference image generated from the inspection data 6. The developed reticle 11 that has been detected as being free of a defect by the reticle inspection device 7 is decided as a good reticle and becomes an inspected reticle.

Figure 3:
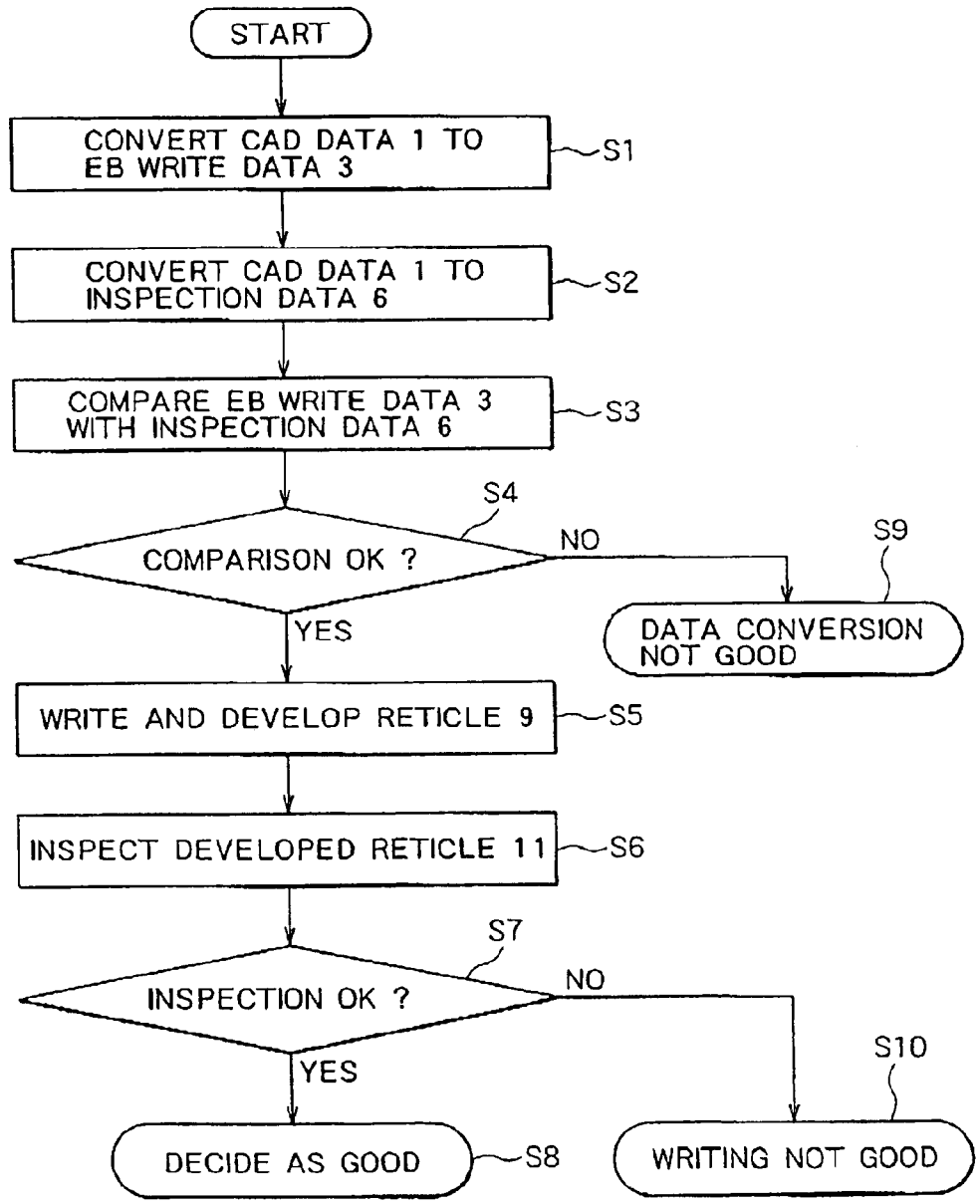
FIG. 3 is a flowchart illustrating the operation of the reticle fabrication method according to the first embodiment of the invention.

The operation of the reticle fabrication method according to the embodiment will be discussed below referring to the flowchart shown in FIG. 3. According to the embodiment, first, the first data conversion device 2 converts the CAD data 1 to the EB write data 3 (step S1). Then, the second data conversion device 5 converts the CAD data 1 to the inspection data 6 (step S2). Next, the data verification device 8 compares the EB write data 3 and the inspection data 6 with each other (step S4). If the comparison has resulted in non-coincidence, it is decided that a data conversion error has occurred in either the first data conversion device 2 or the second data conversion device 5, i.e., data conversion is no good (step S9), and it is then verified whether a data conversion error has occurred in the first data conversion device 2 or the first data conversion device 2 which has converted the CAD data 1 to the EB write data 3 or the inspection data 6. If the EB write data 3 coincides with the inspection data 6 in step S4, on the other hand, the EB write data 3 is input to the EB write device 4 where a figure pattern in the EB write data 3 is written on an unwritten reticle 9 which in turn developed to be a developed reticle 11 (step S5). The developed reticle 11 is inspected by the reticle inspection device 7 (step S6). If the inspection result is successful (step S7), the developed reticle 11 can be decided as a good reticle (step S8), whereas if a defect is detected on the developed reticle 11 in step S7, it is decided that the defect has occurred in the EB writing process, i.e., writing is no good (step S10).

Figure 4:
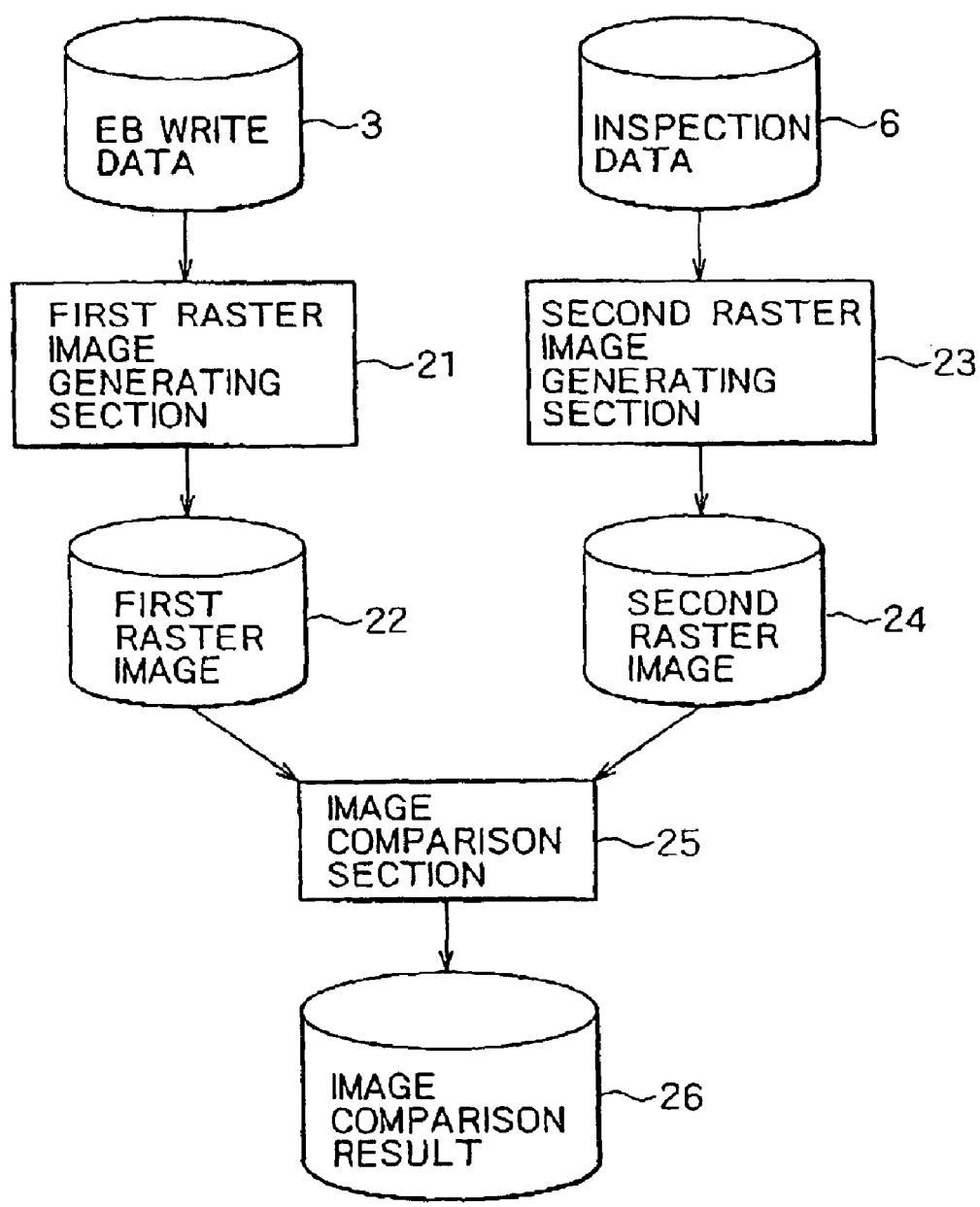
FIG. 4 is a flowchart showing one example of a data verification scheme which is carried out by a data verification device according to the invention.

The following will discuss the details of the data verification device scheme executed by the data verification device 8. As shown in FIG. 2, the EB write data 3 and the inspection data 6 are input to the data verification device 8. FIG. 4 is a flowchart showing one example of the data verification scheme which is carried out by the data verification device 8. As shown in FIG. 4, the EB write data 3 input to the data verification device 8 undergoes data conversion to be a first raster image 22 in a first raster image generating section 21 which generates a raster image to be used in an electron beam writing device of a raster scan and stage continuous moving type. Likewise, the inspection data 6 input to the data verification device 8 undergoes data conversion to be a second raster image 24 in a second raster image generating section 23. An image comparison section 25 compares those first raster image 22 and second raster image 24 with each other and outputs an image comparison result 26 which indicates whether those image information coincide with each other or not.

Figure 5A:
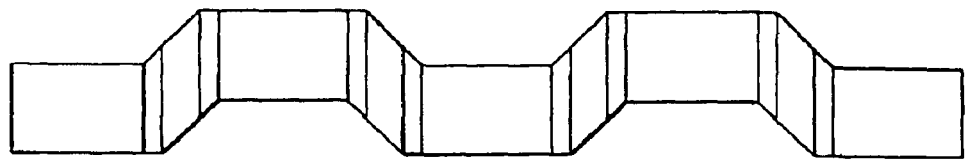
FIGS. 5A through 5D are diagrams showing examples of data at individual sections in the data verification device according to the invention.
Figure 5B:
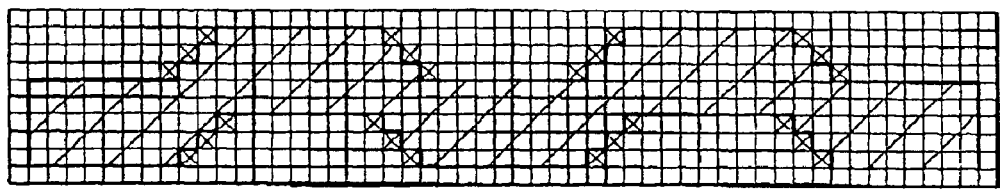
Figure 5C:
Figure 5D:
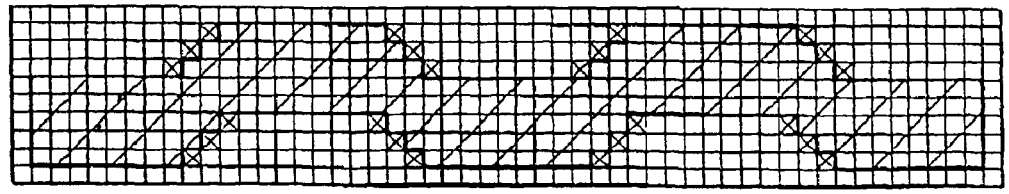

FIGS. 5A through 5D are diagrams showing examples of data at individual sections in the data verification device 8 shown in FIG. 4. Because the EB write device 4 differs from the reticle inspection device 7 in the device structure and characteristic, the EB write data 3 and the inspection data 6 which are data converted from the same CAD data and including the same figure information but have figure patterns of different expression forms are respectively input to the EB write device 4 and the reticle inspection device 7. Specifically, the EB write data 3 in FIG. 4 is input to the data verification device 8 as data constructed by the combination of a plurality of rectangles, trapezoids and parallelepipeds as shown in FIG. 5A while the inspection data 6 in FIG. 4 is input to the data verification device 8 as data constructed by the combination of a single rectangle and a plurality of trapezoids as shown in FIG. 5C. To accurately compare the EB write data 3 and the inspection data 6, converted to figure patterns of different expression forms, with each other, therefore, those data are converted to raster images of the same expression form in the data verification device 8. FIG. 5B shows an example of the first raster image 22 which is generated by data conversion of the EB write data 3 as shown in FIG. 5A in the first raster image generating section 21. In the first raster image 22 shown in FIG. 5B, the hatched area is a figure area to be written on a reticle with an EB and portions indicated by marks "X" at the outer edge portions of the hatched area are those to be written in different tones with an EB. FIG. 5D shows an example of the second raster image 24 which is generated by data conversion of the inspection data 6 as shown in FIG. 5C in the second raster image generating section 23. Because the first raster image 22 and second raster image 24 have the same expression form, they can be compared with each other easily by the image comparison section 25.

Figure 6:
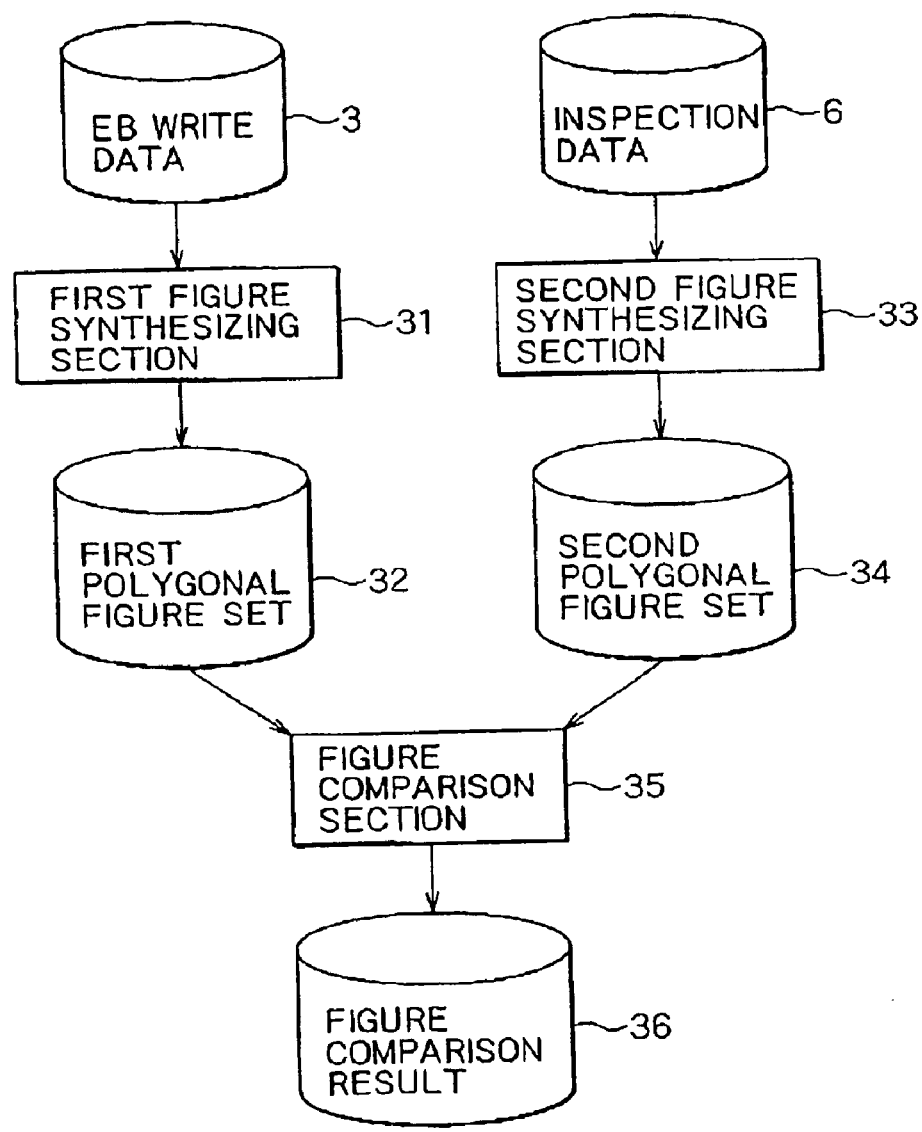
FIG. 6 is a flowchart showing another example of the data verification scheme which is executed by the data verification device according to the invention.

FIG. 6 is a flowchart showing another example of the data verification scheme which is executed by the data verification device 8. The EB write data 3 input to the data verification device 8 undergoes data conversion in a first figure synthesizing section 31, yielding a first set of polygonal figures (hereinafter called "first polygonal figure set") 32, as shown in FIG. 6. The inspection data 6 input to the data verification device 8 likewise undergoes data conversion in a second figure synthesizing section 33, yielding a second set of polygonal figures (hereinafter called "second polygonal figure set") 34. A figure comparison section 35 compares those second first polygonal figure set 32 and second polygonal figure set 34 with each other and outputs a figure comparison result 36 which indicates whether those figure information coincide with each other or not.

Figure 7A:
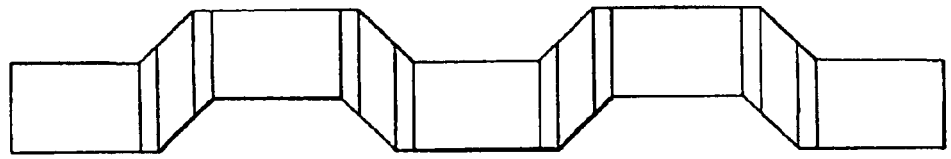
FIGS. 7A through 7D are diagrams showing examples of data at individual sections in the data verification device according to the invention.
Figure 7B:
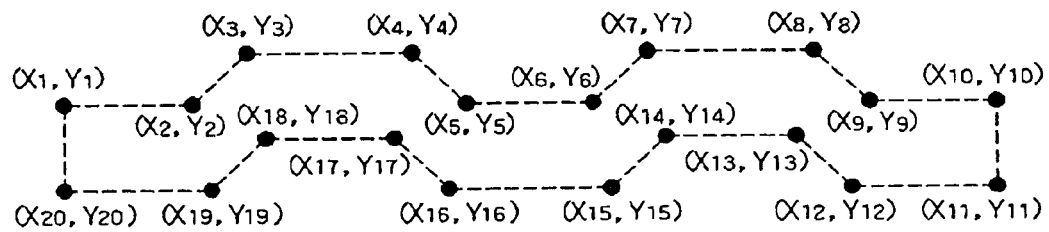
Figure 7C:
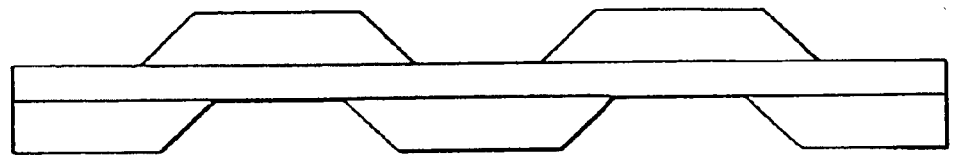
Figure 7D:
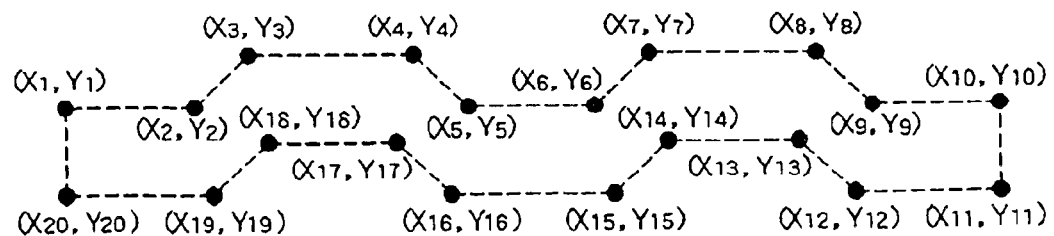

FIGS. 7A through 7D are diagrams showing examples of data at individual sections in the data verification device 8 shown in FIG. 6. As in the example shown in FIG. 4 and FIGS. 5A–5D, the EB write data 3 in FIG. 6 is input to the data verification device 8 as data constructed by the combination of a plurality of rectangles, trapezoids and parallelepipeds as shown in FIG. 7A while the inspection data 6 in FIG. 6 is input to the data verification device 8 as data constructed by the combination of a single rectangle and a plurality of trapezoids as shown in FIG. 7C. To accurately compare the EB write data 3 and the inspection data 6, converted to figure patterns of different expression forms, with each other, therefore, those data are converted to polygonal figure set information of the same expression form in the data verification device 8. FIG. 7B shows the first polygonal figure set 32 which is generated by data conversion of the EB write data 3 as shown in FIG. 7A in the first figure synthesizing section 31. FIG. 7D shows the second polygonal figure set 34 which is generated by data conversion of the inspection data 6 as shown in FIG. 7C in the second figure synthesizing section 33. As the first polygonal figure set 32 and second polygonal figure set 34 have the same expression form, a sequence of coordinates of the vertexes of one synthesized figure can be easily compared with a sequence of coordinates of the vertexes of the other synthesized figure by figure comparison section 35.

In the embodiment, as shown in FIG. 2, two different first data conversion devices, namely the first data conversion device 2 and the second data conversion device 5, perform data conversion of single CAD data 1 separately, thus generating the EB write data 3 and the inspection data 6 respectively. Even in case where a data conversion error has occurred in one first data conversion device, generating an erroneous figure pattern, it is very unlikely that the same conversion error occurs in the same figure pattern in the other first data conversion device. It is therefore possible to easily detect if there is a data conversion error by comparing the EB write data 3 and the inspection data 6, respectively generated through data conversion of the CAD data 1 in the first data conversion device 2 and the second data conversion device 5, with each other in the data verification device 8. Suppose that there are 100,000,000 figure patterns included in reticle design data needed to fabricate a single reticle and that the probability of occurrence of a data conversion error with respect to a single figure pattern in data conversion in a data conversion device is $10^{-8}$. Under such an assumption, the probability of occurrence of a data conversion error in data conversion of the CAD data 1 to the inspection data 6 with respect to the figure pattern which has generated a data conversion error in the data conversion of the CAD data 1 to the EB write data 3 is likewise $10^{-8}$. Those data conversions are carried out by the separate data conversion devices or the first data conversion device 2 and the second data conversion device 5, the probability, E, of occurrence of the same data conversion error with respect to a single figure pattern, i.e., the probability E that at least one erroneous and improper figure pattern which is not detectable by the data verification device 8 is present in figure patterns included in reticle design data for a single reticle can be computed simply as an independent event occurrence probability as given by the following equation 1.

$$E = 1 - (1 - 10^{-8} \times 10^{-8})^{100000000} = 0.00000001 \qquad (1)$$

It is apparent from the equation 1 that the probability E that at least one erroneous and improper figure pattern which is not detectable by the data verification device 8 is present in figure patterns included in reticle design data for a single reticle is negligibly small. According to the embodiment, therefore, it is possible to surely prevent fabrication of a defective reticle originated from a data conversion error by separately generating the EB write data 3 and the inspection data 6 from the CAD data 1 through data conversion in the first data conversion device 2 and the second data conversion device 5 and allowing the data verification device 8 to verify if there is a data conversion error included in those data before EB writing to fabricate a reticle. In case where a data conversion error is detected by the data verification device 8, it is possible to spontaneously find out the cause for the data conversion error in the data verification device 8 before writing a pattern on the reticle. This makes it possible to avoid writing a pattern on a wasteful defective reticle, simplify the reticle inspection process and shorten the reticle fabrication period. Therefore, the reticle fabrication cost can be reduced significantly. Even in case where a defect on an EB-written and developed reticle 11 is detected by the reticle inspection device 7, it is apparent that the cause for this defect is not originated from a data conversion error, so that it is extremely easy to find out the cause for this defect. Therefore, not only the cause for a defect, such as a data conversion error, which occurs at an early stage of the fabrication process, but also the cause for a defect which is generated at a later stage of the fabrication process, such as the EB writing process or the developing process, can be found out easily at an early stage after the end of the process where such a defect has occurred.

Figure 8:
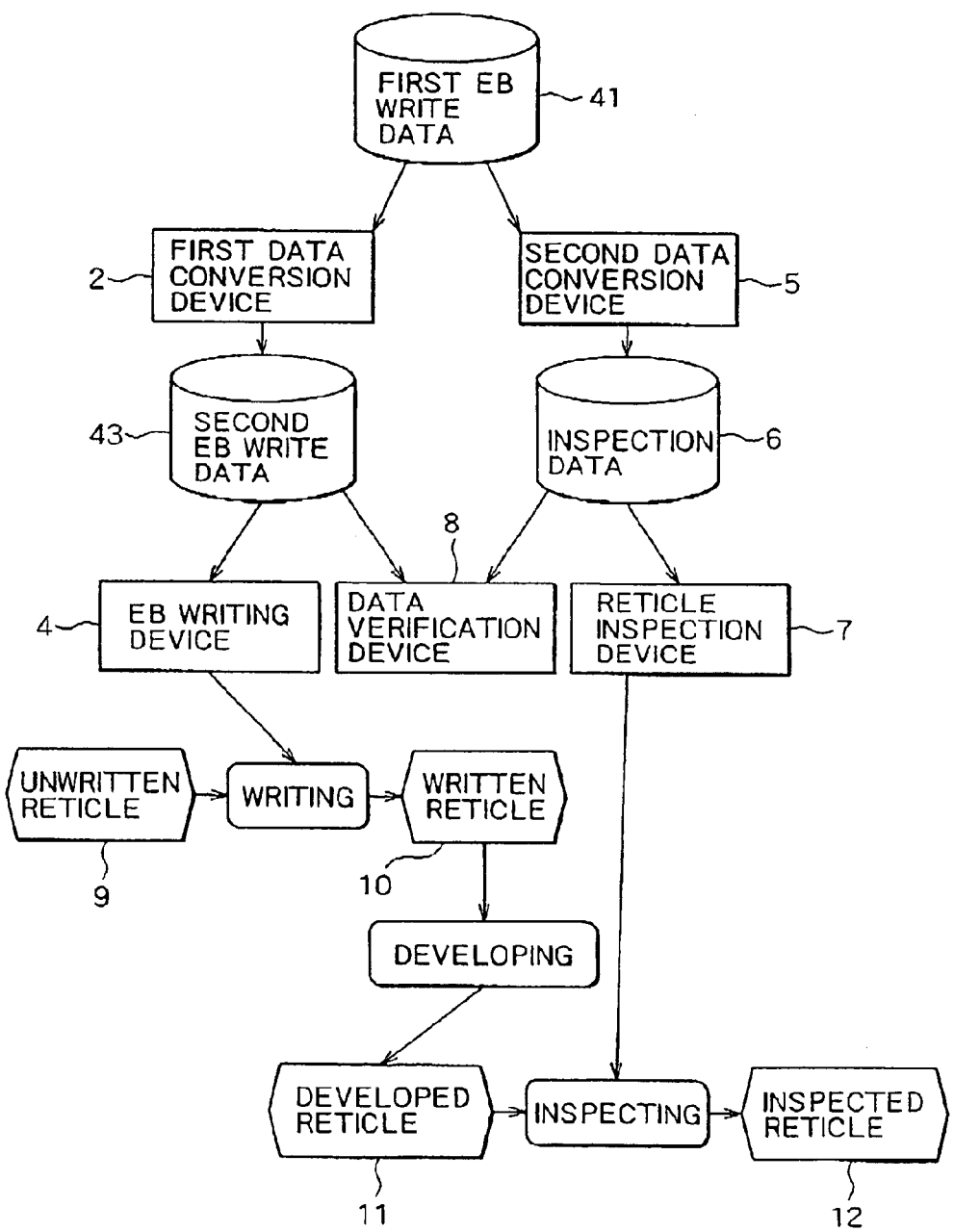
FIG. 8 is a flowchart illustrating a reticle fabrication method according to a second embodiment of the invention.

FIG. 8 is a flowchart illustrating a reticle fabrication method according to the second embodiment of the invention. In this embodiment, first, first EB write data 41 is input as reticle design data to the first data conversion device 2 and a second data conversion device 5. The first data conversion device 2 performs the conversion process, such as rotation, magnification, reduction, expansion or contraction, on a figure pattern contained in the first EB write data 41 and performs format conversion on the resultant data to thereby convert the first EB write data 41 to second EB write data 43. The second data conversion device 5 performs a conversion process and format conversion on the figure pattern contained in the first EB write data 41, which are similar to those done by the first data conversion device 2, thereby converting the first EB write data 41 to inspection data 6. The second EB write data 43 and the inspection data 6 are input to a data verification device 8. The data verification device 8 verifies if the first data conversion device 2 and the second data conversion device 5 have performed data conversion correctly by comparing information on the figure patterns contained in the input second EB write data 43 and inspection data 6 with each other, as per the first embodiment. If the data verification device 8 verifies that the second EB write data 43 is data correctly converted from the first EB write data 41, the second EB write data 43 is input to the EB write device 4 and is used as data for the EB write device 4 to write a figure pattern based on the first EB write data 41 on an unwritten reticle 9. The EB write device 4 writes the figure pattern on the unwritten reticle 9 based on the input second EB write data 43, thereby yielding a written reticle 10. The written reticle 10 is developed to become a developed reticle 11 which is in turn inspected by the reticle inspection device 7. The reticle inspection device 7, which is supplied with the inspection data 6, generates a reference image from the input inspection data 6. The reticle inspection device 7 also generates a to-be-inspected image from information obtained by scanning the surface of the developed reticle 11 with an ultraviolet laser and inspects if the figure pattern matching with the information of the first EB write data 41 is correctly formed on the developed reticle 11 by comparing the to-be-inspected image with the reference image generated from the inspection data 6. The developed reticle 11 that has been detected as being free of a defect by the reticle inspection device 7 is decided as a good reticle and becomes an inspected reticle.

Figure 9:
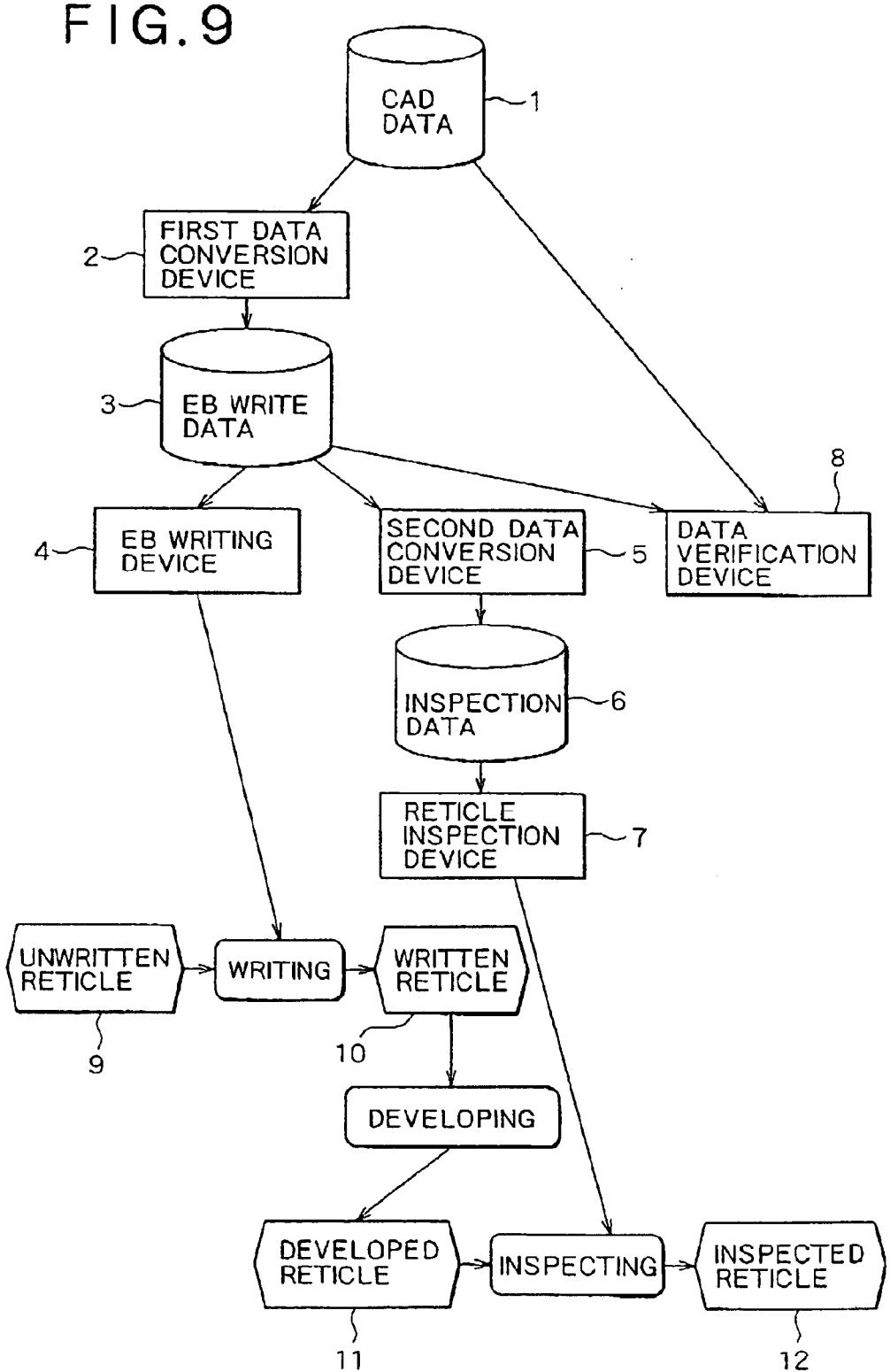
FIG. 9 is a flowchart illustrating a reticle fabrication method according to a third embodiment of the invention.

FIG. 9 is a flowchart illustrating a reticle fabrication method according to the third embodiment of the invention. In the embodiment, CAD data 1 or reticle design data is input to the first data conversion device 2 and the second data conversion device 5. The first data conversion device 2 performs a conversion process, such as rotation, magnification, reduction, expansion or contraction, on a figure pattern contained in the CAD data 1 and performs format conversion on the resultant data to thereby convert the CAD data 1 to EB write data 3. The data verification device 8 to which the CAD data 1 and the EB write data 3 are input verifies if the first data conversion device 2 and the CAD data 1 has been correctly converted to the EB write data 3 in the first data conversion device 2 by comparing figure information included in those pieces of data with each other, as per the first embodiment. If the data verification device 8 does not detect a data conversion error, the EB write data 3 is input to the EB write device 4 and the second data conversion device 5. The EB write device 4 having received the EB write data 3 writes the figure pattern on the unwritten reticle 9 based on the input EB write data 3, thereby yielding a written reticle 10. The written reticle 10 is developed to become a developed reticle 11 which is in turn inspected by the reticle inspection device 7. The second data conversion device 5 which has received the EB write data 3 performs a conversion process and format conversion on the EB write data 3, which are similar to those done by the first data conversion device 2, thereby converting the EB write data 3 to inspection data 6. The inspection data 6 is input to the reticle inspection device 7 which in turns verifies if the figure pattern matching with the information of the EB write data 3 is correctly formed on the developed reticle 11 by comparing a reference image generated from the inspection data 6 with a to-be-inspected image generated from information obtained by scanning the surface of the developed reticle 11 with an ultraviolet laser. The developed reticle 11 that has been detected as being defectless by the reticle inspection device 7 is decided as a good reticle and becomes an inspected reticle.

Figure 10:
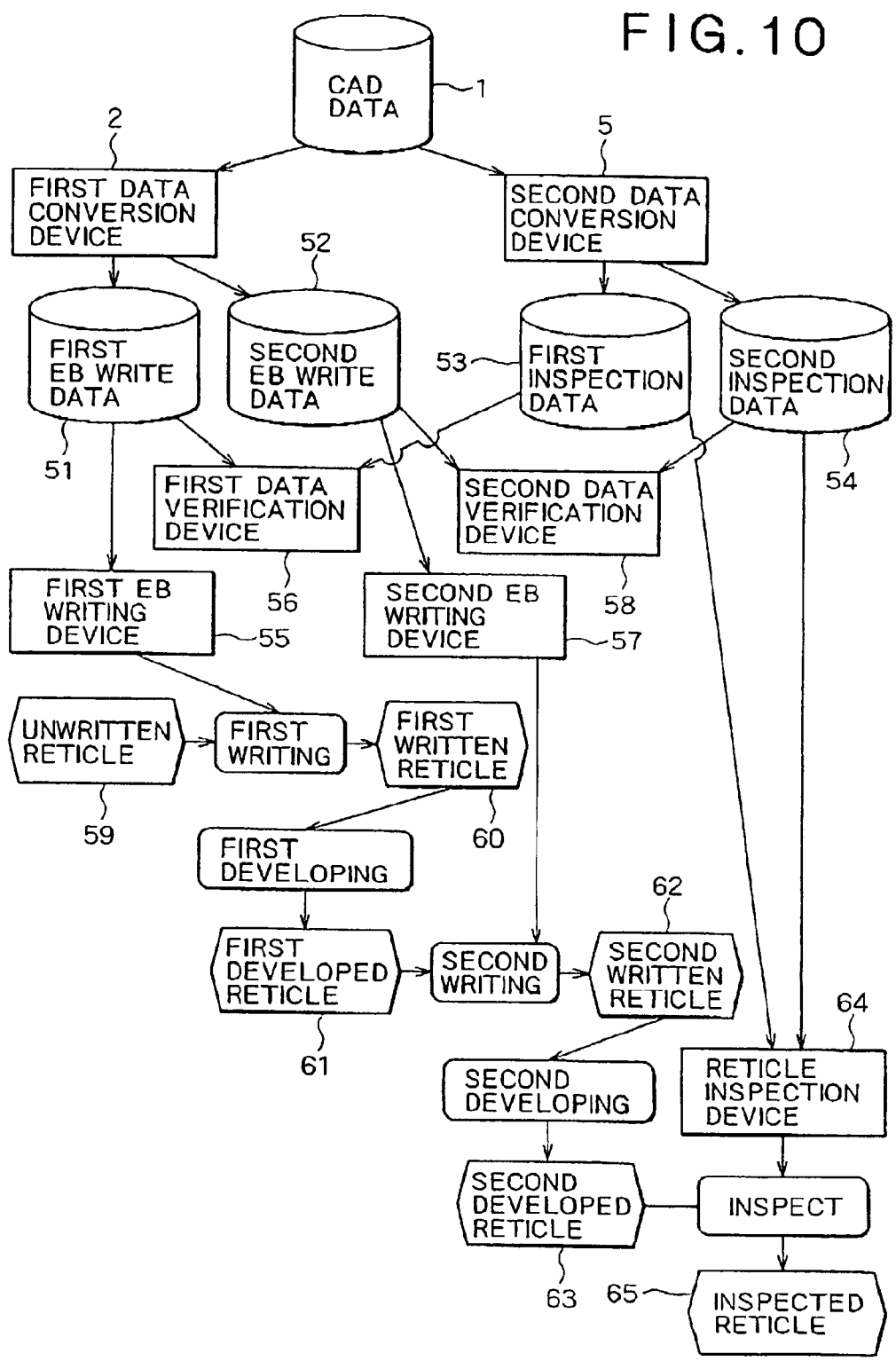
FIG. 10 is a flowchart illustrating a reticle fabrication method according to a fourth embodiment of the invention.

A reticle fabrication method according to the fourth embodiment of the invention will be discussed below referring to the flowchart illustrated in FIG. 10. This embodiment is suitable for use in a reticle fabrication method which performs each of the EB writing process and developing process on a single reticle twice as done for a tritone mask and a phase shift mask which are used in super resolution techniques, such as OPC and phase shifting. In the embodiment, CAD data 1 or reticle design data is input to the first data conversion device 2 and the second data conversion device 5. The first data conversion device 2 performs a conversion process, such as rotation, magnification, reduction, expansion or contraction, on a figure pattern contained in the CAD data 1 and performs format conversion on the resultant data to thereby convert the CAD data 1 to first EB write data 51 and second EB write data 52. The second data conversion device 5 performs a conversion process and format conversion on the figure pattern contained in the CAD data 1, which are similar to those done by the first data conversion device 2, thereby converting the CAD data 1 to first inspection data 53 and second inspection data 54. The first EB write data 51 and the first inspection data 53 are input to a first data verification device 56, and the second EB write data 52 and the second inspection data 54 are input to a second data verification device 58. The first data verification device 56 and the second data verification device 58 verify if the first data conversion device 2 and the second data conversion device 5 have performed data conversion correctly by respectively comparing information on the figure patterns included in the input first EB write data 51 and first inspection data 53 with each other and comparing information on the figure patterns included in the input second EB write data 52 and second inspection data 54 with each other. If the first data verification device 56 and the second data verification device 58 verify that both of the first EB write data 51 and the second EB write data 52 are data correctly converted from the CAD data 1, the first EB write data 51 is input to a first EB write device 55 and is used as data for the first EB write device 55 to write a figure pattern based on the CAD data 1 on an unwritten reticle 59. The first EB write device 55 writes the figure pattern on the unwritten reticle 59 based on the input first EB write data 51, thereby yielding a first written reticle 60. The first written reticle 60 is developed, with its unnecessary portion, such as the remaining Cr film, removed, and becomes a first developed reticle 61 on which a first pattern is formed. Meanwhile, the second EB write data 52 is input to a second EB write device 57 and is used as data for the second EB write device 57 to write a figure pattern based on the CAD data 1 on the first developed reticle 61. The second EB write device 57 writes the figure pattern on the first developed reticle 61 coated with a photoresist, based on the input second EB write data 52, thereby yielding a second written reticle 62. The second written reticle 62 is developed, with its unnecessary portion, such as the remaining halftone film, removed and a part removed by etching of the glass layer of the surface of the quartz glass substrate, and becomes a second developed reticle 63 on which a second pattern is formed. The first inspection data 53 and second inspection data 54 are input to a reticle inspection device 64. The reticle inspection device 64 generates a reference image for reticle inspection from those first inspection data 53 and second inspection data 54 and compares this reference image with a to-be-inspected image generated from information obtained by scanning the surface of the second developed reticle 63 with an ultraviolet laser to verify if the figure pattern which matches with the information of the CAD data 1 is correctly formed on the second developed reticle 63 which has undergone pattern formation twice. The second developed reticle 63 that has been detected as defectless in the inspection performed by the reticle inspection device 64 is decided as a good reticle and becomes an inspected reticle.

A reticle which is fabricated by the reticle fabrication method according to the invention is not limited to a reticle as a mask which is used in the photolithography technology that uses conventional short-wavelength light sources, such as g rays, i rays, KrF and ArF, but may be a mask which is used in the photolithography technology that uses light sources of an ultrashort-wavelength range, such as VUV and EUV, and the photolithography technology that uses other light sources than ultraviolet rays, such as X rays and EB.

What is claimed is:

1. A reticle fabrication method comprising the steps of:
   converting CAD (Computer Aided Design) data which is reticle design data to electron beam write data by means of a first data conversion device and to inspection data by means of a second data conversion device;
   comparing said electron beam write data with said inspection data in a data verification device to verify whether or not there is a data conversion error;
   fabricating a reticle using said electron beam write data after verifying that said electron beam write data is data correctly converted from said CAD data; and
   inspecting a quality of said reticle based on said inspection data.

2. The reticle fabrication method according to claim 1, wherein said data verification device verifies whether or not there is a data conversion error by converting said electron beam write data and said inspection data to raster images to be used by an electron beam writing device of a raster scan and stage continuous moving type and comparing said raster images with each other.

3. The reticle fabrication method according to claim 1, wherein said data verification device verifies whether or not there is a data conversion error by converting said electron beam write data and said inspection data to two-dimensional coordinate data and comparing said two-dimensional coordinate data with each other.

4. A reticle fabrication method comprising the steps of:
   converting first electron beam write data for writing a figure pattern on a reticle based on reticle design data to second electron beam write data by means of a first data conversion device and to inspection data by means of a second data conversion device;
   comparing said second electron beam write data with said inspection data in a data verification device to verify whether or not there is a data conversion error;
   fabricating a reticle using said second electron beam write data after verifying that said second electron beam write data is data correctly converted from said first electron beam write data; and
   inspecting a quality of said reticle based on said inspection data.

5. The reticle fabrication method according to claim 4, wherein said data verification device verifies whether or not there is a data conversion error by converting said electron beam write data and said inspection data to raster images to be used by an electron beam writing device of a raster scan and stage continuous moving type and comparing said raster images with each other.

6. The reticle fabrication method according to claim 4, wherein said data verification device verifies whether or not there is a data conversion error by converting said electron beam write data and said inspection data to two-dimensional coordinate data and comparing said two-dimensional coordinate data with each other.

7. A reticle fabrication method comprising the steps of:
   converting CAD (Computer Aided Design) data which is reticle design data to electron beam write data by means of a first data conversion device;
   comparing said electron beam write data with said CAD data in a data verification device to verify whether or not there is a data conversion error;
   fabricating a reticle using said electron beam write data after verifying that said electron beam write data is data correctly converted from said CAD data; and
   inspecting a quality of said reticle based on inspection data acquired by performing data conversion of said electron beam write data by means of a second data conversion device.

8. The reticle fabrication method according to claim 7, wherein said data verification device verifies whether or not there is a data conversion error by converting said electron beam write data and said inspection data to raster images to be used by an electron beam writing device of a raster scan and stage continuous moving type and comparing said raster images with each other.

9. The reticle fabrication method according to claim 7, wherein said data verification device verifies whether or not there is a data conversion error by converting said electron beam write data and said inspection data to two-dimensional coordinate data and comparing said two-dimensional coordinate data with each other.

10. A reticle fabrication method comprising the steps of:
    converting CAD (Computer Aided Design) data which is reticle design data to first electron beam write data and second electron beam write data by means of a first data conversion device and to first inspection data and second inspection data by means of a second data conversion device;
    comparing said first electron beam write data with said first inspection data in a first data verification device to verify whether or not there is a data conversion error;
    comparing said second electron beam write data with said second inspection data in a second data verification device to verify whether or not there is a data conversion error;
    fabricating a reticle using said first and second electron beam write data after verifying that said first and second electron beam write data are data correctly converted from said CAD data; and
    inspecting a quality of said reticle based on said first and second inspection data.

11. The reticle fabrication method according to claim 10, wherein said data verification device verifies whether or not there is a data conversion error by converting said electron beam write data and said inspection data to raster images to be used by an electron beam writing device of a raster scan and stage continuous moving type and comparing said raster images with each other.

12. The reticle fabrication method according to claim 10, wherein said data verification device verifies whether or not there is a data conversion error by converting said electron beam write data and said inspection data to two-dimensional coordinate data and comparing said two-dimensional coordinate data with each other.

* * * * *